(12) United States Patent
Mitarai et al.

(10) Patent No.: US 7,701,021 B2
(45) Date of Patent: Apr. 20, 2010

(54) FUNCTIONAL DEVICE, SEMICONDUCTOR DEVICE, AND ELECTRONIC DEVICE

(75) Inventors: Shun Mitarai, Tokyo (JP); Masahiro Tada, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/849,584

(22) Filed: Sep. 4, 2007

(65) Prior Publication Data

US 2008/0054495 A1    Mar. 6, 2008

(30) Foreign Application Priority Data

Sep. 5, 2006    (JP) .............................. 2006-240675

(51) Int. Cl.
*H01L 23/28* (2006.01)
(52) U.S. Cl. ........................ 257/414; 257/415; 257/416; 257/787; 257/E32.116
(58) Field of Classification Search ................. 257/414, 257/415, 416, 787, E32.116
See application file for complete search history.

(56) References Cited

U.S. PATENT DOCUMENTS 6,630,725 B1 * 10/2003 Kuo et al. .................... 257/659
6,884,650 B2 * 4/2005 Lee et al. ...................... 438/51
2005/0023629 A1 * 2/2005 Ding et al. ................... 257/414

FOREIGN PATENT DOCUMENTS

| JP | 05-055537 | 3/1993 |
| JP | 10-135771 | 5/1998 |
| JP | 2002-094328 | 3/2002 |
| JP | 2005-262686 | 9/2005 |
| WO | 2005-061375 | 7/2005 |

OTHER PUBLICATIONS

Japanese Office Action dated Jul. 30, 2008 for Application No. 2006-240675.

* cited by examiner

*Primary Examiner*—Tan N Tran
(74) *Attorney, Agent, or Firm*—Sonnenschein Nath & Rosenthal LLP (57) ABSTRACT

A functional device in which the functional portion is not influenced by events in film forming, and thereby the reliability of the device can be improved is provided. The functional device includes a substrate, one or a plurality of functional portions formed on a surface of the substrate, a sealing layer that forms a space around the functional portion, and has one or a plurality of apertures sealed with a filling material, and one or a plurality of walls formed between the functional portion and the aperture without separating the space.

20 Claims, 10 Drawing Sheets

FUNCTIONAL DEVICE, SEMICONDUCTOR DEVICE, AND ELECTRONIC DEVICE

CROSS REFERENCES TO RELATED APPLICATIONS

The present invention contains subject matter related to Japanese Patent Application JP 2006-240675 filed in the Japanese Patent Office on Sep. 5, 2006, the entire contents of which being incorporated herein by reference.

BACKGROUND OF THE INVENTION

1. Field of the Invention

The present invention relates to a functional device subject to hermetical sealing, a semiconductor device including the functional device, and an electronic device including the functional device.

2. Description of the Related Art

As the integration technology has been improved in these years, a small and light-weight electronic device operating with a low voltage, a low electrical consumption, and a high frequency has been rapidly developed. Meanwhile, the electronic device needs the higher functions. As one of techniques to solve the foregoing tasks opposite to each other, MEMS (Micro Electro Mechanical System: micromachine) has attracted attentions. The MEMS is a system in which a micromechanical element and an electronic circuit element are fused by the silicon processing technique. The elemental technology of the MEMS has the superior characteristics such as the high precision processing. Therefore, the MEMS can realize a small and inexpensive SoC (System on a Chip) with the high functions.

Accordingly, the elemental technology of the MEMS is used in various application fields such as various sensors, fluid, optics, RF, storage, and biotechnology. As an MEMS device using such a technology, for example, a mixer for a communication circuit can be cited. The mixer has a movable portion using mechanical resonance on a substrate. Resonance is made in a frequency (intermediate frequency) as a difference between a frequency of an RF signal and a frequency of an LO signal. The signal of the intermediate frequency is outputted as an IF signal.

In a functional device including a functional portion such as the foregoing movable portion using the elemental technology of the MEMS described above, there is a possibility that the characteristics of the device are changed due to influence of an external environment such as temperature, pressure, moisture in the air, and dust, leading to lowering of the reliability of the device. In particular, in the step of mounting the MEMS device, the MEMS device is exposed to an environment severer than that in usage. Therefore, in some cases, the characteristics of the device are largely deteriorated, and the yield is lowered. In the case that mechanical resonance is used for operation of the functional portion, in some cases, the device is desirably operated under a reduced pressure in view of the characteristics. For the reasons mentioned above, in the MEMS device, to secure the mechanical operation space of the functional portion and maintain a stable environment, the functional portion needs to be hermetically sealed.

In the past, for hermetically sealing the functional portion, a method to directly cover the functional portion by bonding an airtight package has been employed. In this method, however, the manufacturing cost is high. Therefore, in recent years, many methods to hermetically seal the functional portion at the wafer level have been suggested. For example, the following method can be cited. A sealing layer is formed on the surface of a sacrifice layer covering the entire functional portion. After an aperture is formed in part of the sealing layer, the sacrifice layer is removed by selective etching through the aperture. Finally, the aperture is sealed by using a film forming method. Thereby, the functional portion is hermetically sealed. Further, in Japanese Unexamined Patent Publication No. 2002-94328, the following method is disclosed. The functional portion is arranged in a concave portion of a substrate, and an electrode spreading as an umbrella is formed in the upper part of the functional portion, a void (aperture) is provided between the substrate and the electrode, and the aperture is sealed by sputtering method. Thereby, the functional portion is hermetically sealed.

SUMMARY OF THE INVENTION

When the functional portion is hermetically sealed by the foregoing method, however, there is a following shortcoming. That is, when the distance between the functional portion and the aperture is small, the functional portion is influenced by events in film forming such as an event that a filling material is accumulated on the functional portion through the aperture. Thereby, there is a possibility that the characteristics of the device are changed, leading to lowering the reliability of the device. Such a shortcoming occurs not only in the case using the elemental technology of the MEMS, but also occurs widely in functional devices subject to hermetical sealing generally.

In view of the foregoing, in the invention, it is desirable to provide a functional device in which the functional portion is not influenced by events in film forming and thereby the reliability can be improved, a semiconductor device, and an electronic device.

According to an embodiment of the invention, there is provided a functional device including one or a plurality of functional portions on the surface of a substrate. Around the functional portion, a sealing layer that forms a space around the functional portion and has one or a plurality of apertures sealed with a filling material is provided. In the space formed by the sealing layer, one or a plurality of walls are provided. The wall is formed between the functional portion and the aperture without separating the space. A semiconductor device and an electronic device according to an embodiment of the invention include the foregoing functional device connected to one device and the other device. "Surface of the substrate" is a concept including the surface of another substrate provided on the surface of the substrate, in addition to the surface of a single substrate. In addition, when a layer is formed on the surface of the substrate, "surface of the substrate" is a concept including the surface of such a layer.

In the functional device, the semiconductor device, and the electronic device according to the embodiment of the invention, the wall is formed between the functional portion and the aperture without separating the space formed by the sealing layer. Therefore, when the aperture is sealed by using any of various film forming methods (vapor deposition method, sputtering method, CVD method or the like), it is possible to block the filling material by the wall, and prevent the filling material from intruding on the functional portion behind the wall.

According to the functional device, the semiconductor device, and the electronic device of the embodiment of the invention, the wall is formed between the functional portion and the aperture without separating the space formed by the sealing layer. Therefore, when the aperture is sealed by using any of various film forming methods, it is possible to prevent the filling material from reaching the functional portion.

Thereby, events in film forming do not influence on the functional portion, and thus the reliability of the device is improved.

Other and further objects, features and advantages of the invention will appear more fully from the following description.

DETAILED DESCRIPTION OF THE PREFERRED EMBODIMENTS

Descriptions will be given of an embodiment of the invention in detail with reference to the drawings.

Figure 1:
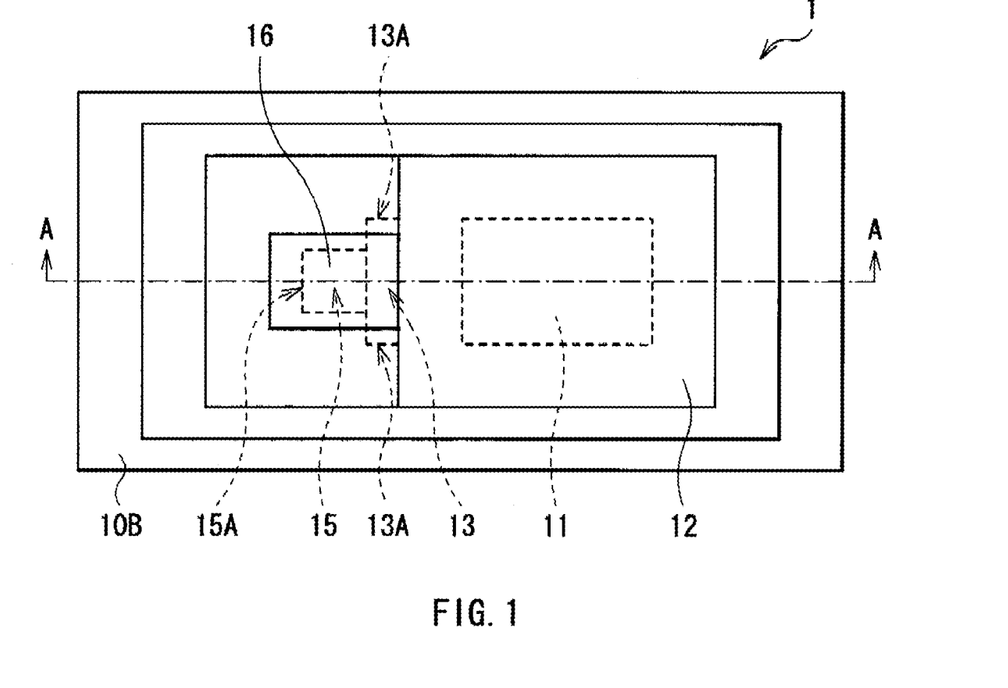
FIG. 1 is a top structural view of an MEMS device according to an embodiment of the invention.
Figure 2:
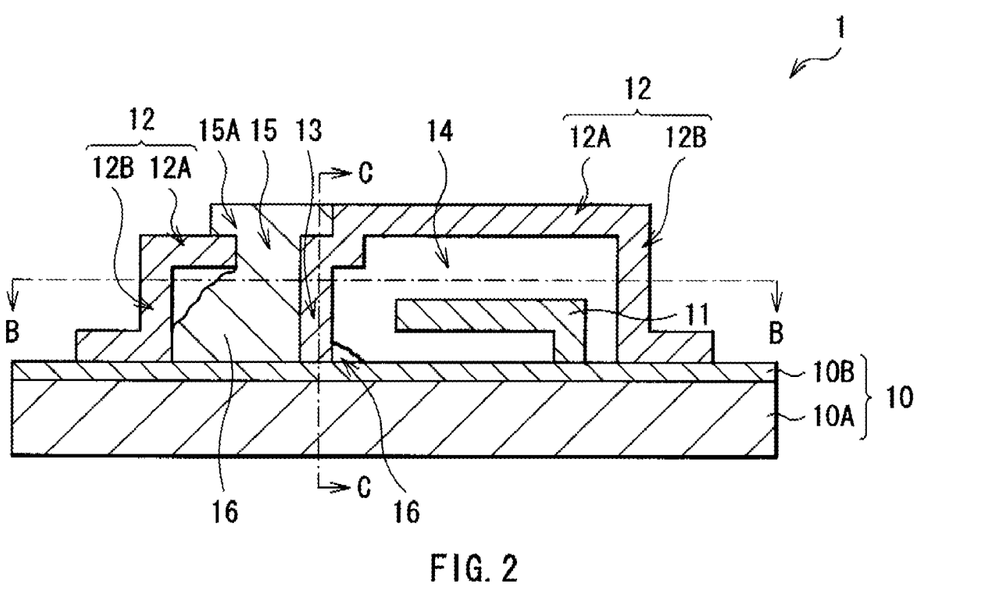
FIG. 2 is a cross section structural view taken along the arrows A-A of FIG. 1.
Figure 3:
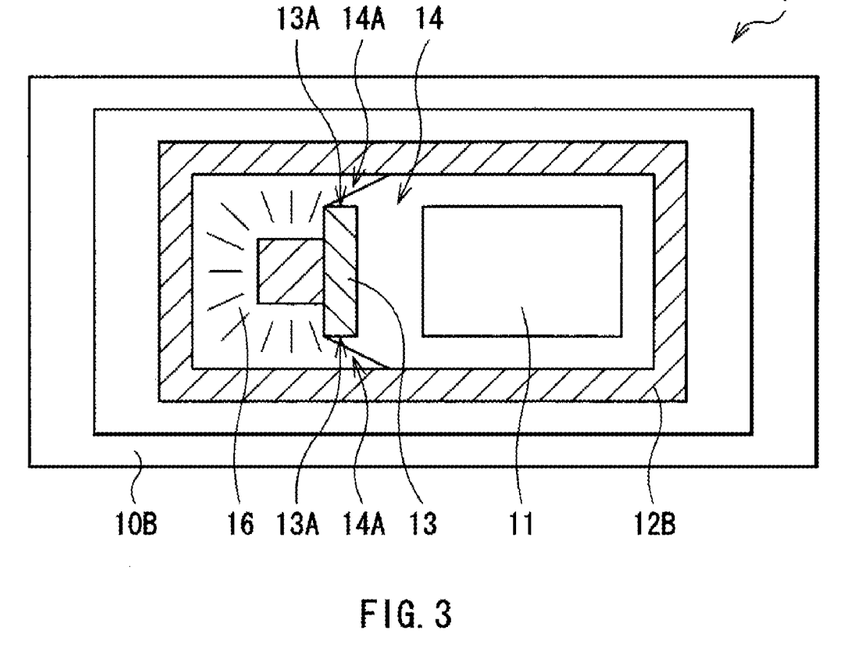
FIG. 3 is a cross section structural view taken along the arrows B-B of FIG. 2.
Figure 4:
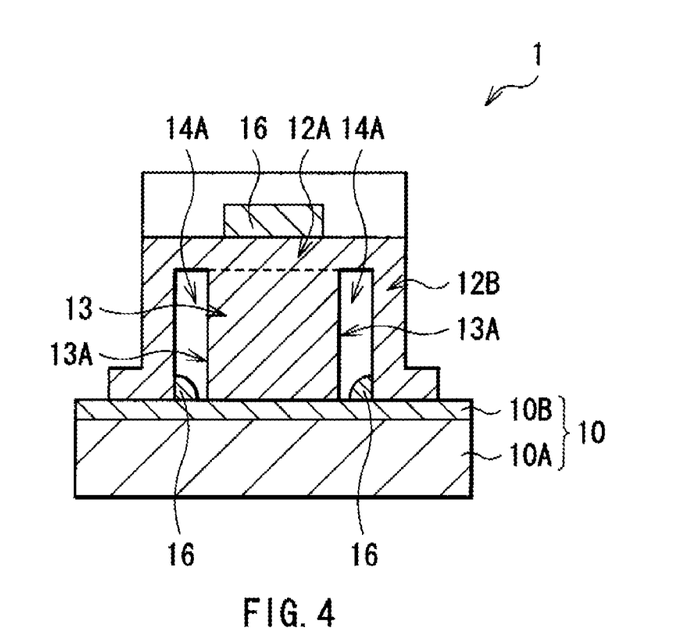
FIG. 4 is a cross section structural view taken along the arrows C-C of FIG. 2.

FIG. 1 shows a top view structure of an MEMS device 1 (functional device) according to an embodiment of the invention. FIG. 2 shows a cross sectional structure taken along the arrows A-A of FIG. 1. FIG. 3 shows a cross sectional structure taken along the arrows B-B of FIG. 2. FIG. 4 shows a cross sectional structure taken along the arrows C-C of FIG. 2.

In the MEMS device 1, a movable portion 11 (functional portion) that mechanically operates is hermetically sealed at the wafer level. The MEMS device 1 includes the movable portion 11, a sealing layer 12, and a wall 13 on the surface of a substrate 10 (refer to FIG. 2).

In the substrate 10, a foundation layer 10B is formed on the surface of a support base 10A (refer to FIG. 2). The semiconductor substrate 10A is, for example, a semiconductor substrate made of silicon (Si), gallium arsenic (GaAs) or the like, or an insulative substrate made of quartz, glass or the like. The foundation layer 10B is made of a material such as SiN that works as an etching stop layer when the after-mentioned sacrifice layer R2 is removed by an etchant.

The movable portion 11 is made of, for example, polysilicon, and is formed on the surface of the foundation layer 10B (refer to FIG. 2). The movable portion 11 has a structure mechanically movable according to an electrical signal from the outside. For example, as will be described in detail in the application example, when the movable portion has a structure that mechanically resonates in a frequency of a difference between a frequency of an RF signal and a frequency of an LO signal (intermediate frequency), the MEMS device 1 can function as a mixer for a high frequency circuit that outputs the signal of the intermediate frequency as an IF signal according to the RF signal and the LO signal from the outside.

The sealing layer 12 is made of a material such as SiN that is not etched and remains when the after-mentioned sacrifice layer R2 is removed by the etchant. The sealing layer 12 includes a ceiling part 12A formed in the air at a given distance from both the movable portion 11 and the surrounding of the movable portion 11 in the surface of the substrate 10; and a side wall 12B that is formed integrally with the ceiling part 12A and is formed in contact with the surface of the substrate 10 (refer to FIG. 2). That is, the sealing layer 12 has a dome shape, forms an internal space 14 around the movable portion 11, and functions as a cavity that separates the movable portion 11 from the outer environment. As described later, the sealing layer 12 is formed by using, for example, reduced pressure CVD (chemical vapor deposition) method, and protects the movable portion 11 at the wafer level.

In the sealing layer 12, an aperture 15 is formed in the region other than the region opposing to the movable portion 11 in the sealing layer 12, that is, in the region of the sealing layer 12 not opposing to the movable portion 11 (refer to FIG. 2). As will be described later, the aperture 15 is used as a through hole of the etchant for removing the sacrifice layer R2 covering the surrounding of the movable portion 11 in the course of manufacturing. After the sacrifice layer R2 is removed, the aperture 15 is sealed by a sealing member 17 made of a filling material such as Al. Thereby, the internal space 14 is hermetically sealed, and the movable portion 11 is totally separated from the outside environment.

The wall 13 is formed integrally with the sealing layer 12 in the internal space 14, and is formed in contact with the surface of the substrate 10 (refer to FIG. 2 and FIG. 4). Therefore, the wall 13 functions as a supporting column for supporting the ceiling part 12A of the sealing layer 12.

Further, the wall 13 is formed between the movable portion 11 and the aperture 15. Between each of both side faces 13A in the direction perpendicular to the direction in which the movable portion 11 and the aperture 15 are opposed to each other and the side wall 12B of the sealing layer 12, a void 14A (refer to FIG. 3 and FIG. 4) is formed. That is, the space on the movable portion 11 side of the internal space 14 is communicated to the space on the aperture 15 side through the void 14A. The wall 13 is formed not to separate the internal space 14. Thereby, the etchant flowed through the aperture 15 when the sacrifice layer R2 is removed can be flowed through the void 14A to the movable portion 11 side.

Figure 5:
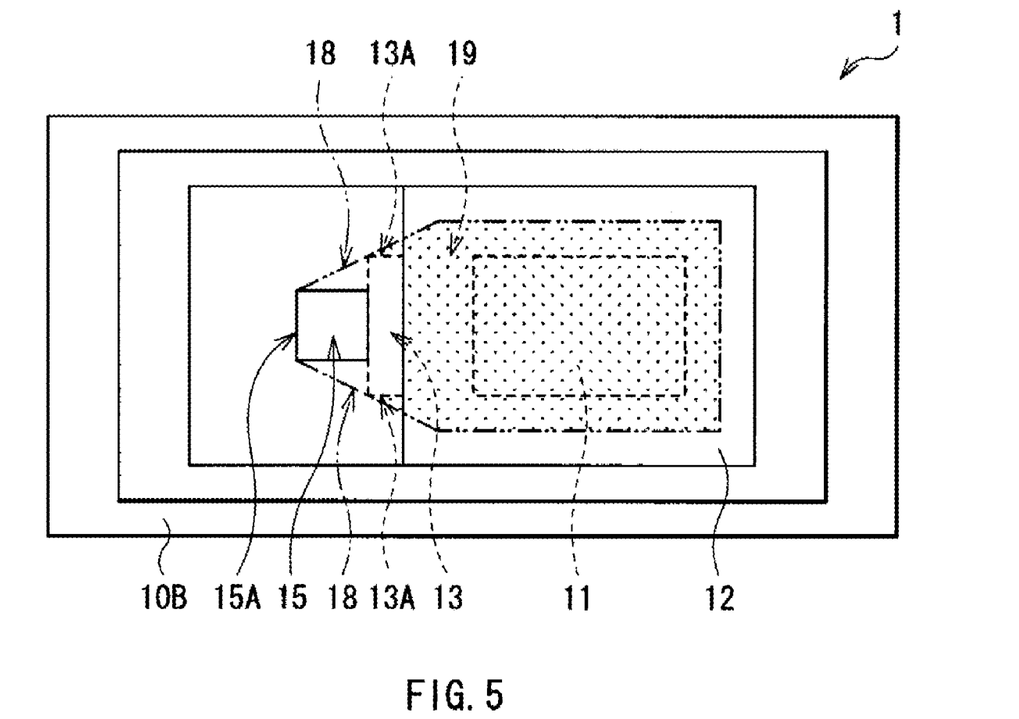
FIG. 5 is a top structural view for explaining a shadow space.

As shown in the top view of FIG. 5 (the sealing member 17 is omitted), in the internal space 14, a space (shadow space 19) is formed. In the shadow space 19, a line penetrating the aperture 15 but not penetrating the sealing layer 12 and the wall 13 does not traverse.

In FIG. 5, as the line penetrating the aperture 15 but not penetrating the sealing layer 12 and the wall 13, a straight line 18 is shown. The straight line 18 joins the end farthest from the wall 13 in the aperture 15 (farthest end 16A, refer to FIGS. 1 to 3 and FIG. 5) and the end of each of the both side faces 13A of the wall 13. The straight line 18 is also a boundary for spatially differentiating the space in which the line penetrating the aperture 15 but not penetrating the sealing layer 12 and the wall 13 traverses from the shadow space 19.

The shadow space 19 corresponds to a space that is blocked by the wall 13 and the sealing layer 12, and thus is not able to be seen from the outside through the aperture 15. More specifically, the shadow space 19 corresponds to the space excluding the space trimmed by the straight line 18 from the space on the movable portion 11 side of the internal space 14.

In this embodiment, the movable portion 11 is arranged in the shadow space 19. Thereby, when the aperture 15 is sealed by depositing a filling material in the aperture 15 with the use of any of various film forming methods (vapor deposition method, sputtering method, CVD or the like), the filling material is prevented from intruding on the movable portion 11 behind the wall 13.

Next, a description will be given of an example of a method of manufacturing the MEMS device 1 having the foregoing structure.

Figure 6A:
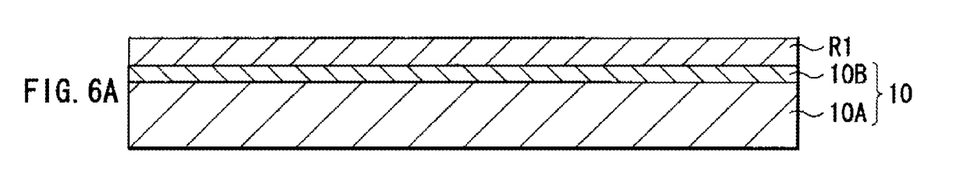
FIGS. 6A to 6E are cross section structural views for explaining manufacturing steps of the MEMS device of FIG. 1.
Figure 6B:
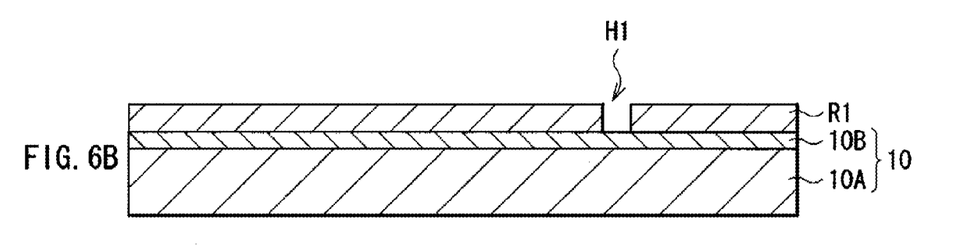
Figure 6C:
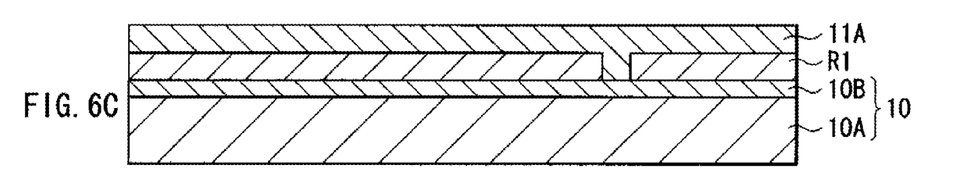
Figure 6D:
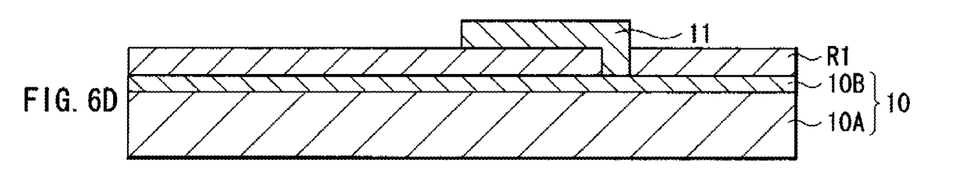
Figure 6E:
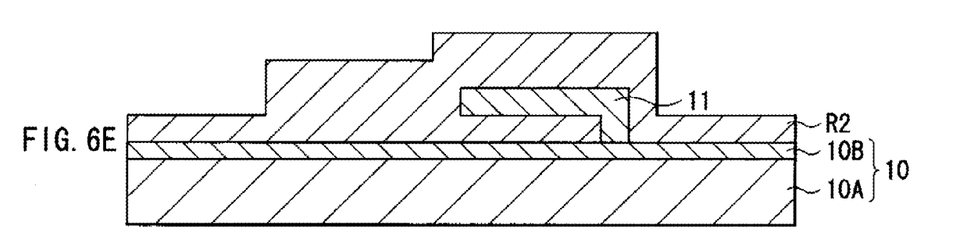

First, the foundation layer 10B and a sacrifice layer R1 are layered in this order over the support base 10A (FIG. 6A). After that, an aperture H1 for forming part of the movable portion 11 is formed in the sacrifice layer R1 (FIG. 6B). Next, a movable portion 11A is formed over the entire surface (FIG. 6C). After that, the movable portion 11A is selectively etched, and thereby the movable portion 11 is formed (FIG. 6D). Subsequently, a sacrifice layer is formed to cover the entire movable portion 11. In the result, the sacrifice layer R2 is formed from such a sacrifice layer and the sacrifice layer R1 (FIG. 6E).

Figure 7A:
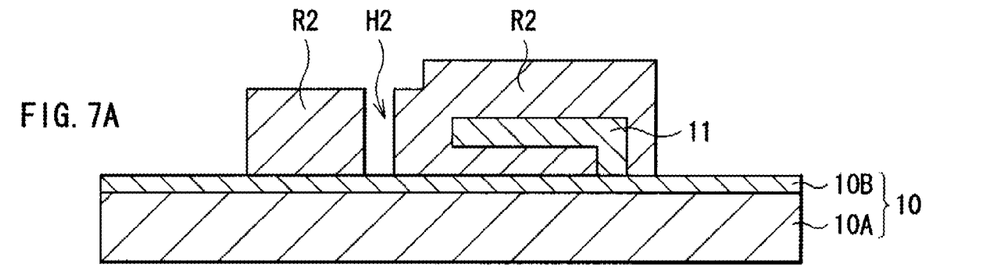
FIGS. 7A to 7D are cross section structural views for explaining manufacturing steps following FIGS. 6A to 6E.
Figure 7B:
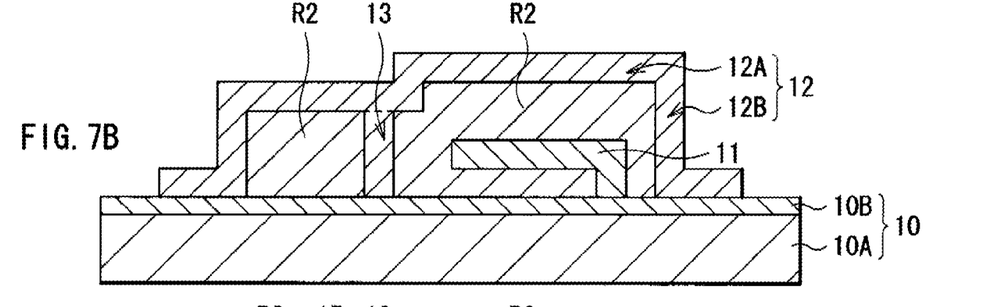
Figure 7C:
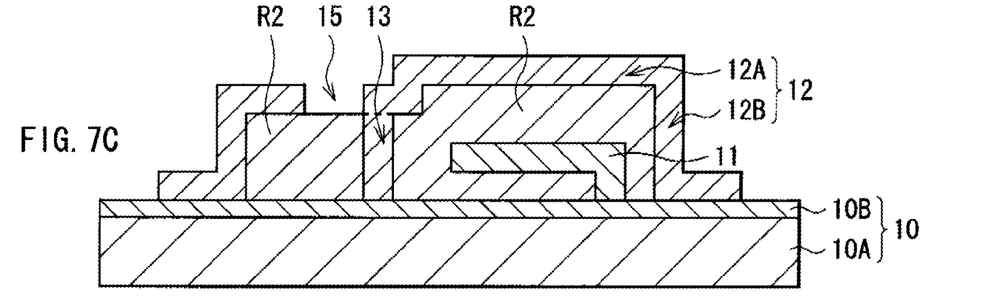
Figure 7D:
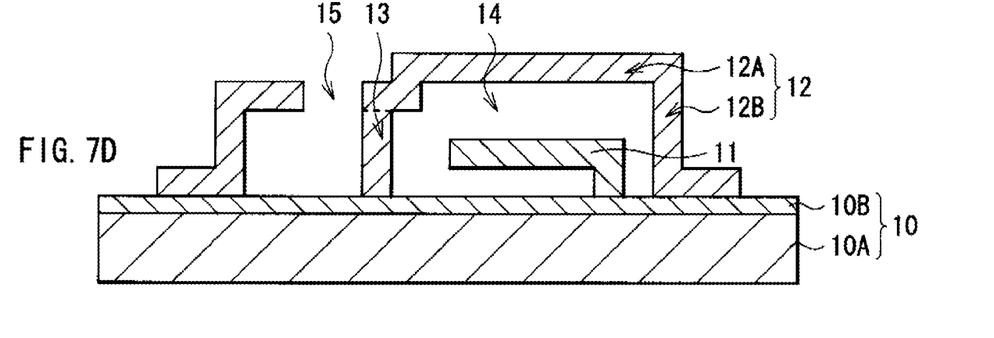

Next, the sacrifice layer R2 is selectively etched, and thereby the sacrifice layer R2 is left around the movable portion 11 and an aperture H2 is formed (FIG. 7A). After that, the sealing layer 12A is formed over the entire surface of the sacrifice layer R2, and the wall 13 is formed integrally with the sealing layer 12A in the aperture H2 (FIG. 7B). Next, the aperture 15 is formed in the sealing layer 12A to form the sealing layer 12 (FIG. 7C). After that, an etchant is flowed through the aperture 15, the sacrifice layer R2 is removed, and thereby the internal space 14 is formed (FIG. 7D).

Next, a filling material is deposited in the aperture 15 by using any of various forming methods to seal the aperture 15 (FIG. 2). Thereby, the internal space 14 is hermetically sealed, and the movable portion 11 is totally separated from the outside environment. Thereby, the MEMS device 1 is formed.

When the filling material is deposited in the aperture 15 by using any of various forming methods as described above, the filling material is scattered in the internal space 14. Therefore, in the existing MEMS devices, there is a possibility that the scattered filing material is adhered to the movable portion, and thus the characteristics of the device are changed and the reliability of the device is lowered. Therefore, in the past, the method to detach the aperture from the movable portion has been employed in order to prevent the filling material from being adhered to the movable portion. In such a method, however, the layout size is increased. Therefore, instead of detaching the aperture from the movable portion, the diameter of the aperture 15 may be decreased to reduce the scattering area of the filing material. However, when the diameter of the aperture 15 is decreased as above, an etchant hardly enters through the aperture 15. In the result, there is a possibility not only the etching time becomes longer, but also the device is largely damaged by the etchant.

Meanwhile, in this embodiment, the wall 13 is provided between the aperture 15 and the movable portion 11. Therefore, when the aperture 15 is sealed, the filling material, which passes the aperture 15 and is scattered toward the movable portion 11 is blocked by the wall 13, is deposited between the aperture 15 and the wall 13. Meanwhile, the filling material that passes the aperture 15 and is scattered toward the different direction of the movable portion 11 is blocked by the wall 13 and is deposited between the aperture 15 and the wall 13, or falls in the void 14A or in the vicinity thereof and then is deposited. That is, the filling material is blocked by the wall 13, and does not intrude on the movable portion 11 arranged behind the wall 13 (shadow space 19).

As described above, in this embodiment, the wall 13 is provided between the aperture 15 and the movable portion 11. Thereby, when the filling material is deposited in the aperture 15 by using any of various forming methods, the filling material is prevented from intruding on the movable portion 11 arranged in the shadow space 19. Thereby, there is no possibility that the movable portion 11 is influenced by events in film forming. In the result, the characteristics of the device are not changed, and the reliability of the device is improved.

In particular, when a forming method with the directivity (vapor deposition method, sputtering method or the like) is employed, the filling material hardly intrudes on the shadow space 19. Thereby, even when the movable portion 11 is provided in the space where the filling material can reach in the case that the wall 13 is not provided, there is no possibility that the movable portion 11 is influenced by events in film forming. Thereby, the distance between the aperture 15 and the movable portion 11 can be decreased. Thus, the layout size can be reduced without lowering the reliability of the device. In the result, the dead space can be decreased, and thus the foot print can be decreased.

Further, in this embodiment, as described above, the layout size can be decreased without purposely decreasing the diameter of the aperture 15. Accordingly, the internal space 14 can be also decreased. Therefore, the volume capacity of the sacrifice layer R2 can be decreased, and thus the time necessary for removing the sacrifice layer R2 by the etchant can be reduced. In the result, the degree of damage of the device due to the etchant can be minimized. Further, by providing the wall 13, the distance between the aperture 15 and the movable portion 11 can be freely set. In the result, the degree of freedom of the layout is improved.

MODIFICATIONS

Figure 8:
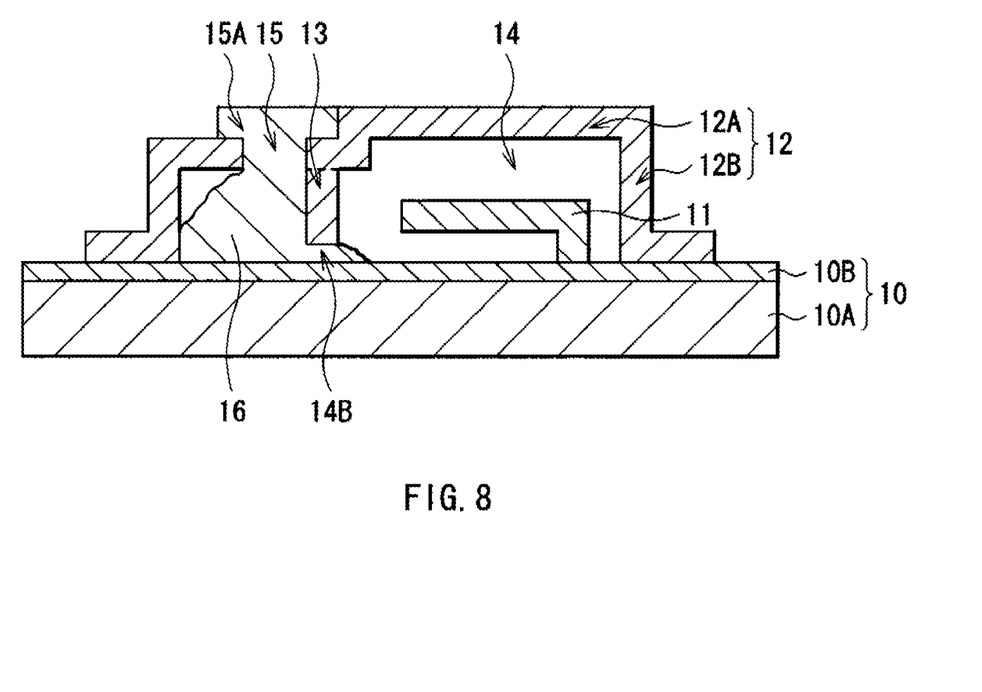
FIG. 8 is a cross section structural view of an MEMS device according to a modification.

In the foregoing embodiment, the wall 13 is formed integrally with the sealing layer 12, and is formed in contact with the surface of the substrate 10. As shown in FIG. 8, however, a void 14B may be provided between the wall 13 and the substrate 10 to the degree that the filling material does not reach the movable portion 11. Thereby, for example, even when the sealing layer 12 is formed from a high-strain material, there is no possibility that a stress is generated in the substrate 10 due to the strain of the sealing layer 12, leading to a crack in the vicinity of the movable portion 11. In the result, the reliability of the device is improved.

Figure 9:
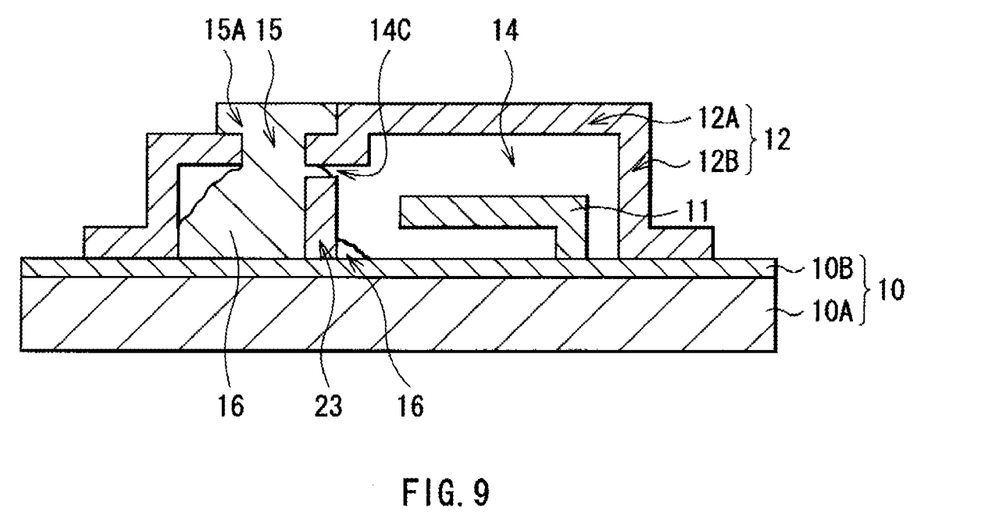
FIG. 9 is a cross section structural view of an MEMS device according to another modification.

In the foregoing embodiment, the wall 13 is formed integrally with the sealing layer 12. Otherwise, the wall 13 may be, for example, formed independently of the sealing layer 12 but in contact with the sealing layer 12. As shown in FIG. 9, a void 14C may be provided between a wall 23 formed independently of the sealing layer 12 and the sealing layer 12 to the degree that the filling material does not reach the movable portion 11. Thereby, for example, even when the sealing layer 12 is formed from a high-strain material, there is no possibility that a stress is generated in the substrate 10 due to the strain of the sealing layer 12, leading to a crack in the vicinity of the movable portion 11. In the result, the reliability of the device is improved. In the case that the wall 23 can be formed with the same height as that of the removable portion 11, the wall 23 can be formed with the movable portion 11 at a time. Thereby, the processing time can be inhibited from being increased.

Figure 10:
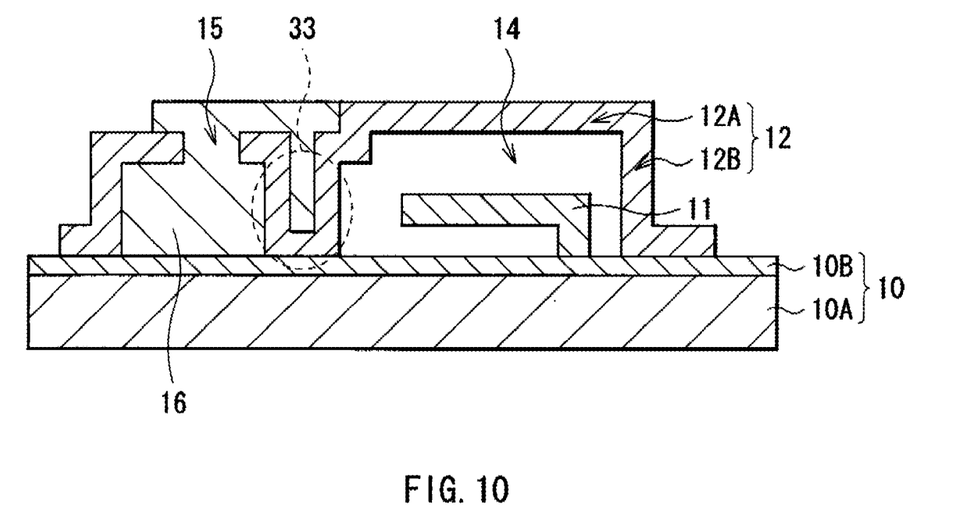
FIG. 10 is a cross section structural view of an MEMS device according to still another modification.
Figure 11:
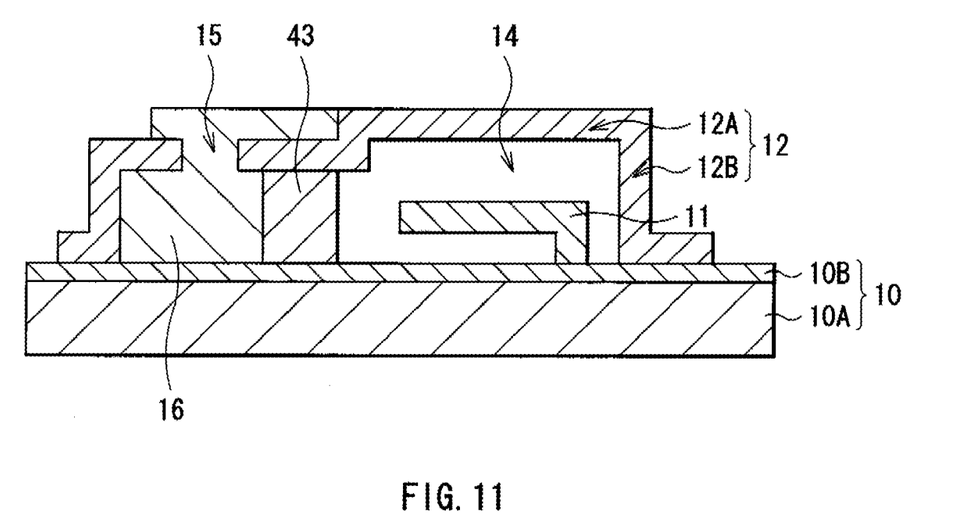
FIG. 11 is a cross section structural view of an MEMS device according to still another modification.

In the foregoing embodiment, the wall 13 composed of one rectangular plate is provided in the internal space 14. However, for example, as shown in FIG. 10, a wall 33 composed of two plates may be provided. Thereby, for example, even when the movable portion 11 is high and the aspect ratio of the aperture H2 is high, the wall 33 can be easily formed integrally with the sealing layer 12. However, when the wall 33 is excessively high, for example, as shown in FIG. 11, a wall 43 with the low aspect ratio is preferably formed. Thereby, a crack is prevented from being generated in the wall 33 and the sealing layer 12 due to stress concentration. In the result, the reliability of the device is improved.

In the foregoing embodiment, the description has been given of the case that one aperture 15 is provided. However, a plurality of apertures 15 may be provided. In this case, only one wall 13 may be provided. However, if the wall 13 is excessively large, there is a possibility that when the sacrifice layer R2 is removed, the sacrifice layer R2 is not sufficiently removed and part thereof is left behind the wall 13. Therefore, in such a case, for example, as shown in the top view of FIG. 12 (the sealing member 17 is omitted), each wall 13 corresponding to each aperture 15 is preferably provided, respectively. Thereby, in the course of manufacturing, the etchant can be flowed through a void formed between each wall 13 to the movable portion 11 side. Therefore, the sacrifice layer R2 can be surely removed in a short time. Thereby, the characteristics of the device can be prevented from being changed due to the residual sacrifice layer R2, and the reliability of the device can be improved. In this case, to inhibit the filling material from reaching the movable portion 11, the movable portion 11 should be provided in a space (shadow space 29) in which a straight line penetrating the aperture 15 but not penetrating the sealing layer 12 and the wall 13 does not traverse.

Figure 12:
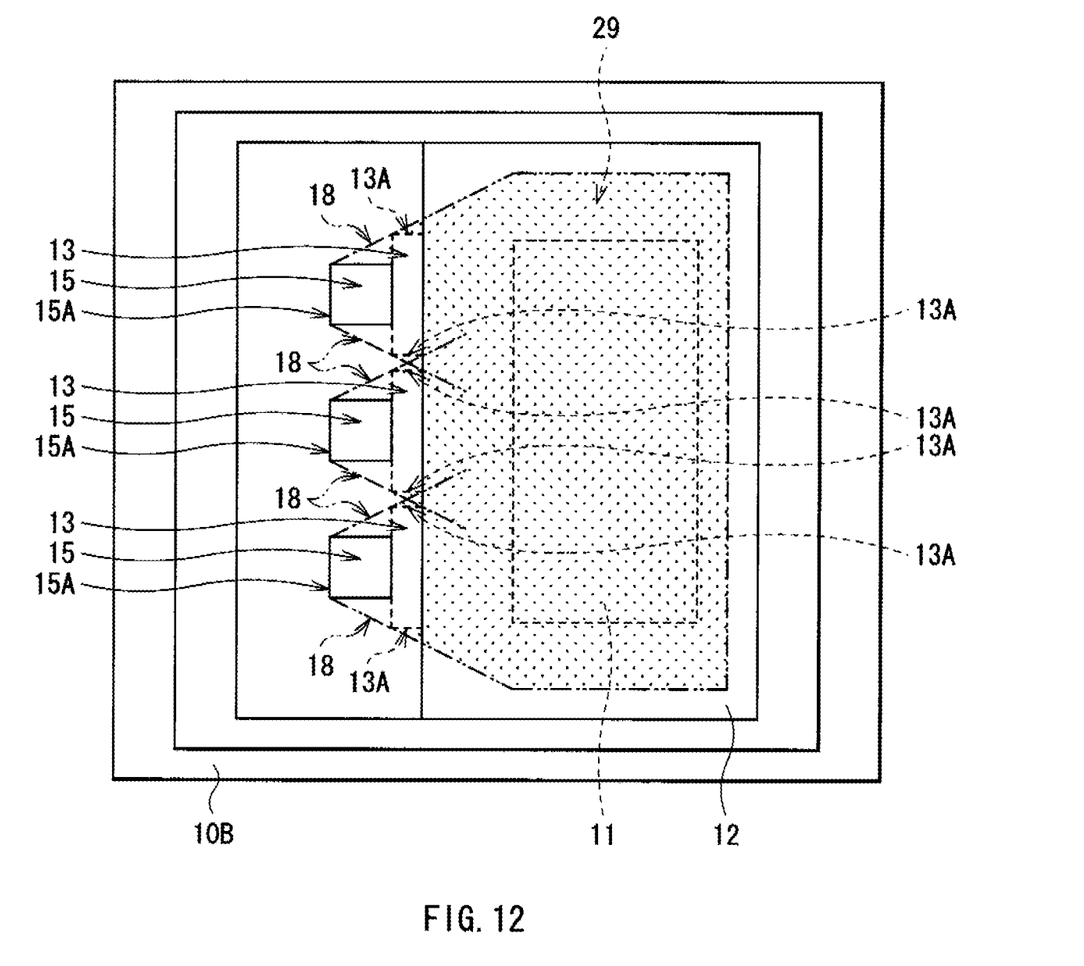
FIG. 12 is a top structural view of an MEMS device according to still another modification.

In FIG. 12, each wall 13 is arranged so that the straight line 18 joining the farthest end 15A of each aperture 15 and the end of each of the both side faces 13A of the wall 13 provided according to each aperture 15 penetrates the adjacent wall 13. Thereby, there is no possibility that the filling material reaches the space on the movable portion 11 side in the internal space 14 via the void formed between each wall 13. Therefore, the movable portion 11 can be arranged in proximity to each wall 13. Thereby, as in the foregoing embodiment, the layout size can be decreased without decreasing the reliability of the device. In the result, the dead space can be decreased, and thus the foot print can be decreased.

Figure 13:
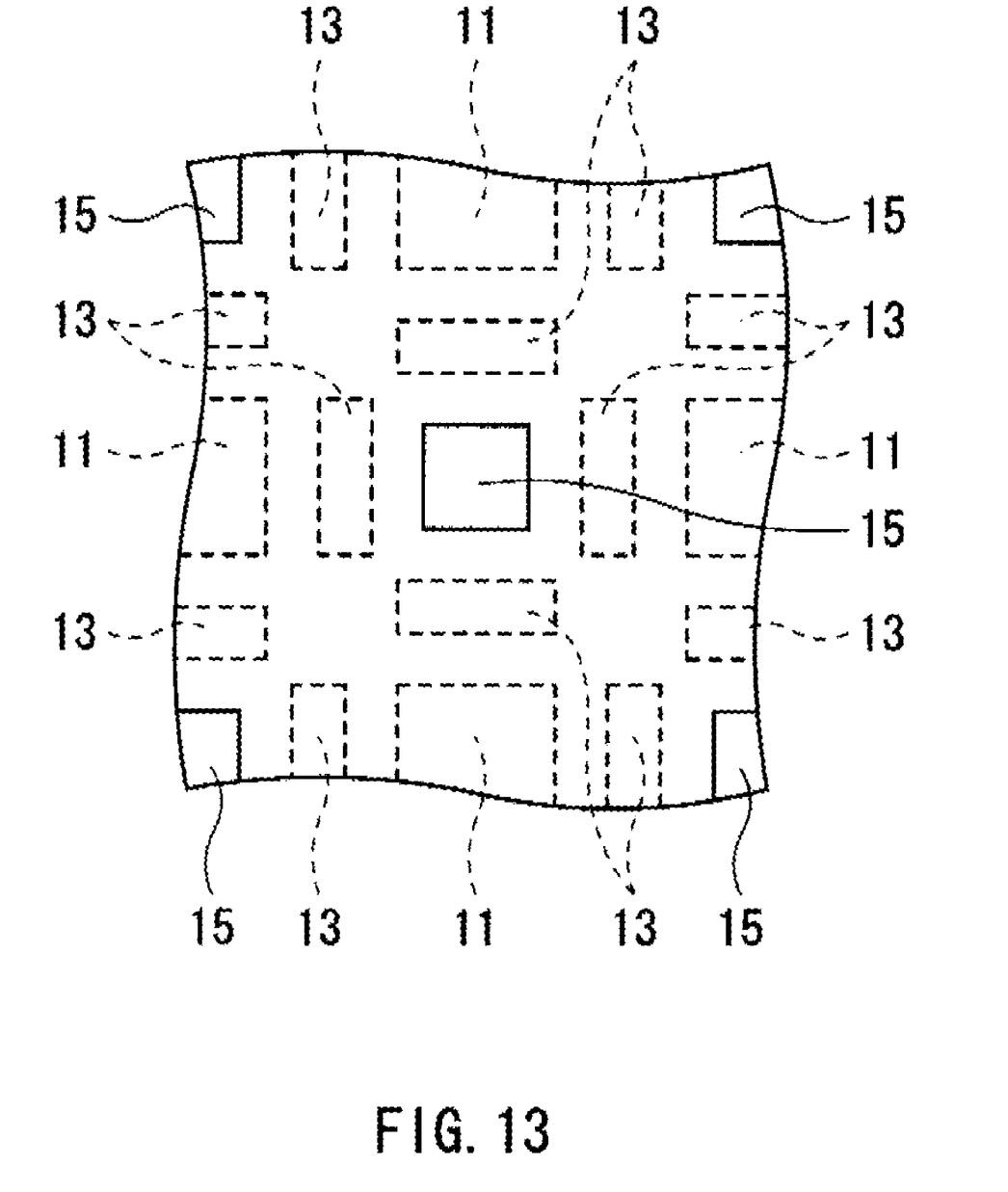
FIG. 13 is a top structural view of an MEMS device according to still another modification.

When a plurality of movable portions 11 are two dimensionally arranged, for example, as shown in FIG. 13, a plurality of apertures 15 can be two dimensionally arranged by using the region where the movable portions 11 are not formed. Then, by using the region where the movable portions 11 and the apertures 15 are not formed, the wall 13 is provided between each movable portion 11 and each aperture 15. Thereby, the movable portion 11 can be prevented from being attached with a scattered filling material. Therefore, the distance between each movable portion 11 and each aperture 15 is not necessarily widened purposely. Thereby, even when the plurality of movable portions 11 are two dimensionally arranged, the layout size can be decreased without lowering the reliability of the device in the same manner as in the foregoing embodiment. In the result, the dead space can be decreased, and thus the foot print can be decreased.

APPLICATION EXAMPLE

Figure 14:
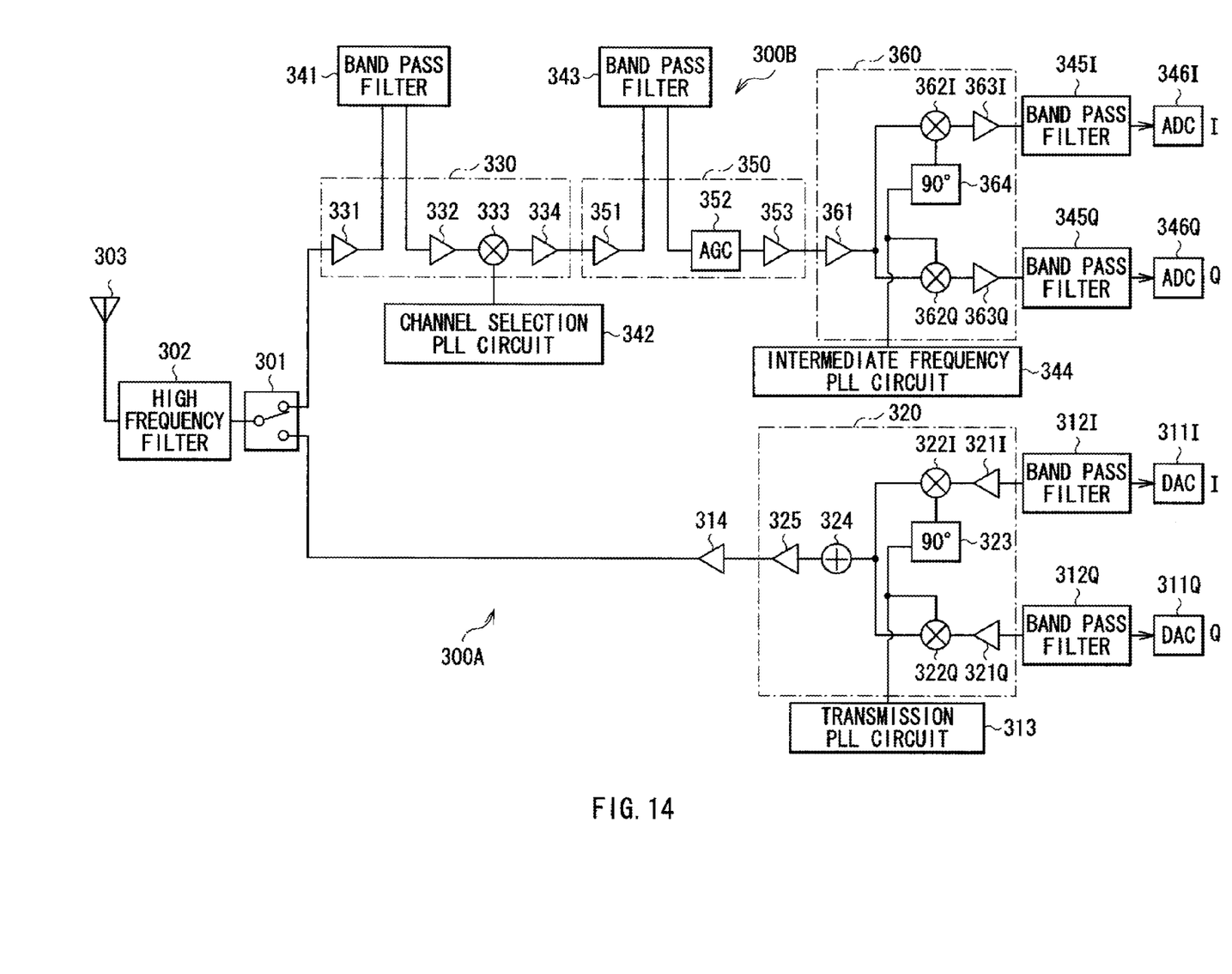
FIG. 14 is a functional block diagram of a communication apparatus according to an application example.

Next, a description will be given of a configuration of a communication apparatus mounting the MEMS device 1 of the foregoing embodiment. FIG. 14 shows a block configuration of the communication apparatus as an electronic device. In a semiconductor device and a module mounting the MEMS device 1 of the foregoing embodiment are embodied by the foregoing communication apparatus, and thus descriptions thereof will be given together.

In this application example, the following description will be given by showing the case mounting the MEMS device 1. However, in the case of mounting the MEMS device according to the foregoing each modification, similar operations and similar effects are obtained as well.

The communication apparatus shown in FIG. 14 mounts the MEMS device 1 described in the foregoing embodiment as mixers 322I, 322Q, 333, 362I and 362Q (semiconductor device). As an example of the communication apparatus, for example, a mobile phone, a personal digital assistant (PDA), a wireless LAN apparatus can be cited. The foregoing mixers 322I, 322Q, 333, 362I and 362Q are formed in a semiconductor device composed of SoC. The communication apparatus includes, for example, as shown in FIG. 14, a transmission circuit 300A (module), a receiving circuit 300B (module), a transmission/receiving switch 301 for switching the transmission/receiving route, a high frequency filter 302, and a transmission and receiving antenna 303.

The transmission circuit 300A includes 2 digital/analog converters (DAC) 311I and 311Q, and 2 band pass filters 312I and 312Q that respectively correspond to transmission data of I channel and transmission data of Q channel, a modulator 320, a transmission PLL (Phase-Locked Loop) circuit 313, and a power amplifier 314. The modulator 320 includes 2 buffer amplifiers 321I and 321Q and 2 mixers 322I and 322Q that respectively correspond to the foregoing 2 band pass filters 312I and 312Q, a phase module 323, an adder 324, and a buffer amplifier 325.

The receiving circuit 300B includes a high frequency section 330, a band pass filter 341, a channel selection PLL circuit 342, an intermediate frequency circuit 350, a band pass filter 343, a demodulator 360, an intermediate frequency PLL circuit 344, 2 band pass filters 345I and 345Q and 2 analog/digital converters (ADC) 346I and 346Q that respectively correspond to receiving data of I channel and receiving data of Q channel. The high frequency section 330 includes a low noise amplifier 331, buffer amplifiers 332 and 334, and a mixer 333. The intermediate frequency circuit 350 includes buffer amplifiers 351 and 353 and an automatic gain controller (AGC) circuit 352. The modulator 360 includes a buffer amplifier 361, 2 mixers 362I and 362Q, and 2 buffer amplifiers 363I and 363Q that respectively correspond to the foregoing 2 band pass filters 345I and 345Q, and a phase module 364.

In the communication apparatus, when transmission data of the I channel and transmission data of the Q channel are inputted to the transmission circuit 300A, each transmission data is processed in the following procedure. That is, first, the transmission data is converted to an analog signal in the DAC 311I and 311Q. Subsequently, signal components other than the band of the transmission signal are removed in the band pass filters 312I and 312Q, and then the resultant signal is supplied to the modulator 320. Subsequently, the signal is supplied to the mixers 322I and 322Q via the buffer amplifiers 321I and 321Q. Subsequently, the resultant signal is mixed with a frequency signal corresponding to the transmission frequency signal supplied from the transmission PLL circuit 313, and then modulated. After that, the both mixed signals are added in the adder 324, and thereby an I system transmission signal is obtained. At this time, for the frequency signal supplied to the mixer 322I the signal phase is shifted 90 degrees in the phase module 323. Thereby, the I channel signal and the Q channel signal are modulated orthogonal to each other. Finally, the signal is supplied to the power amplifier 314 via the buffer amplifier 325. Thereby, the signal is amplified to obtain a given transmission power. The signal amplified in the power amplifier 314 is supplied to the antenna 303 via the transmission/receiving switch 301 and the high frequency filter 302, and thereby is wireless-transmitted via the antenna 303. The high frequency filter 302 functions as a band pass filter for removing signal components other than the frequency band out of a transmitted or received signal in the communication apparatus.

Meanwhile, when a signal is received by the receiving circuit 300B from the antenna 303 via the high frequency filter 302 and the transmission/receiving switch 301, the signal is processed in the following procedure. That is, first, in the high frequency section 330, the received signal is amplified in the low noise amplifier 331. Subsequently, signal components other than the receiving frequency band are removed by the band pass filter 341. After that, the signal is supplied to the mixer 333 via the buffer amplifier 332. Subsequently, the signal is mixed with a frequency signal supplied from the channel selection PPL circuit 342, and a given transmission channel signal is set as an intermediate frequency signal. Thereby, the signal is supplied to the intermediate frequency circuit 350 via the buffer amplifier 334. Subsequently, in the intermediate frequency circuit 350, the signal is supplied to the band pass filter 343 via the buffer amplifier 351. Thereby, signal components other than the band of the intermediate frequency signal are removed. The resultant signal subsequently becomes an almost constant gain signal in the AGC circuit 352. After that, the signal is supplied to the demodulator 360 via the buffer amplifier 353. Subsequently, in the demodulator 360, the signal is supplied to the mixers 362I and 362Q via the buffer amplifier 361. After that, the signal is mixed with a frequency signal supplied from the intermediate frequency PPL circuit 344. Then, the I channel signal component and the Q channel signal component are demodulated. At this time, for the frequency signal supplied to the mixer 362I, the signal phase is shifted 90 degrees in the phase module 364. Thereby, the I channel signal component and the Q channel signal component that are modulated orthogonal to each other are demodulated. Finally, the I channel signal and the Q channel signal are supplied to the band pass filters 345I and 345Q respectively, and thereby signal components other than the I channel signal and the Q channel signal are removed. After that, the signal is supplied to the ADC 346I and 346Q to obtain digital data. Thereby, I channel receiving data and Q channel receiving data is obtained.

The communication apparatus mounts the MEMS device 1 of the foregoing embodiment as the mixers 322I, 322Q, 333, 362I, and 362Q. Therefore, there is no possibility that the communication apparatus is influenced by events in film forming such as adhesion of a filling material, leading to variation of the high frequency characteristics of each mixer. Thereby, the high frequency characteristics are stable in each communication apparatus, and the reliability is high.

In the communication apparatus shown in FIG. 14, the description has been given of the case that the MEMS device 1 of the foregoing embodiment is applied to the mixers 322I, 322Q, 333, 362I, and 362Q (semiconductor device). However, the application example is not limited thereto. For example, the MEMS device 1 can be applied to the transmission/receiving switch 301, the band pass filters 312I, 312Q, 341, 343, 346I, 346Q, or the high frequency filter 302. In this case, effects similar to the foregoing effects can be obtained.

The descriptions have been hereinbefore given of the invention with reference to the embodiment, the modifications, and the application example. However, the invention is not limited to the foregoing embodiment and the like. The structures of the MEMS device and the semiconductor device of the invention, and the configuration of the communication apparatus of the invention and the procedures of the manufacturing methods can be freely modified as long as effects similar to those of the foregoing embodiment and the like can be obtained.

Further, in the foregoing embodiment and the like, the description has been given of the case that the MEMS device of the invention is applied to the electronic device typified by the communication apparatus such as a mobile phone. However, the application example is not necessarily limited thereto, and the invention can be applied to an electronic device other than the communication apparatus. In such a case, effects similar to those of the foregoing embodiment can be obtained.

It should be understood by those skilled in the art that various modifications, combinations, sub-combinations and alternations may occur depending on design requirements and other factors insofar as they are within the scope of the appended claims or the equivalents thereof.

What is claimed is:

1. A functional device comprising:
   a substrate;
   one or more functional portions on a surface of the substrate;
   a sealing layer that forms a space around the one or more functional portions, the sealing layer having one or more apertures; and
   one or more walls between the one or more functional portions and the one or more apertures, the one or more walls defining one or more voids between the one or more apertures and without separating the space,
   wherein,
   each of the one or more walls is in direct contact with the surface of the substrate, each of the one or more apertures are sealed with a filling material to hermetically seal the space.

2. The functional device according to claim 1, wherein the one or more functional portions are arranged in the space in which a straight line penetrating the one or more voids but not penetrating the sealing layer and the one or more walls does not traverse.

3. The functional device according to claim 1, wherein the one or more walls is formed integrally with the sealing layer.

4. The functional device according to claim 3, wherein cracks that form between the substrate and the sealing layer do not reach the one or more functional portions in response to the space separating the sealing layer and the one or more functional portions.

5. The functional device according to claim 1, wherein the one or more apertures and one or more voids allow an echant to remove a sacrificial layer surrounding the one or more functional portions to define the space within the sealing layer.

6. The functional device according to claim 1, wherein the functional portion is mechanically movable in response to an electrical signal from outside the sealing layer.

7. The functional device according to claim 1, wherein the sealing layer is formed in a dome shape.

8. The functional device according to claim 1, wherein the one or more functional portions are arranged behind the wall.

9. The functional device according to claim 8, wherein the one or more voids pass through the one or more walls in a direction that does not intersect with the one or more functional portions.

10. The functional device according to claim 8, wherein the direction of the one or more voids prevents the filling material from reaching the one or more functional portions.

11. A micro electro mechanical system comprising:
a substrate;
one or more functional portions on a surface of the substrate;
a sealing layer that forms a space around the one or more functional portions, the sealing layer having one or more apertures; and
one or more walls between the one or more functional portions and the one or more apertures, the one or more walls defining one or more voids between the one or more apertures and the space,
wherein,
each of the one or more apertures are sealed with a filling material to hermetically seal the space, each of the one or more voids pass through the one or more walls in a direction that does not intersect with the one or more functional portions.

12. The micro electro mechanical system according to claim 11, wherein the one or more walls is formed integrally with the sealing layer, the sealing layer being formed of a high-strain material, cracks that form between the substrate and the sealing layer do not reach the one or more functional portions in response to the space separating the sealing layer and the one or more functional portions.

13. The micro elector mechanical system according to claim 11, wherein the one or more functional devices are mixers.

14. The micro electro mechanical system according to claim 11, wherein the one or more functional devices are mixers.

15. The micro electro mechanical system according to claim 11, wherein the one or more walls extend downward from the sealing layer on one side, the one or more walls separated from the substrate by the one or more voids.

16. The micro elector mechanical system according to claim 11, wherein the direction of the one or more voids prevents the filling material from reaching the one or more functional portions when deposited.

17. An electronic device including a semiconductor device comprising:
a substrate;
one or more functional portions formed on a surface of the substrate;
a sealing layer that forms a space around the one or more functional portions, the sealing layer having one or more apertures; and
one or more walls formed between the one or more functional portions and the one or more apertures, the one or more walls defining one or more voids between the one or more apertures and the space,
wherein,
each of the one or more walls is in direct contact with the surface of the substrate, each of the one or more apertures are sealed with a filling material to hermetically seal the space, the one or more voids pass through the one or more walls in a direction that does not intersect with the one or more functional portions, the one or more functional portions are arranged behind the wall preventing the filling material from reaching the one or more functional portions.

18. The electronic device according to claim 17, wherein the electronic device is a personal wireless communication device, wherein the semiconductor device forms a plurality of mixers for a high frequency circuit, each of the plurality of mixers resonates at a frequency and are protected by the space.

19. The micro elector mechanical system according to claim 17, wherein the one or more functional devices are mixers, the mixers each resonate at a frequency and are protected by the space.

20. The electronic device according to claim 17, wherein the direction of the one or more voids prevents the filling material from touching the one or more functional portions when deposited.

* * * * *